United States Patent [19]
Zachai et al.

[11] Patent Number: 5,525,537
[45] Date of Patent: Jun. 11, 1996

[54] PROCESS OF PRODUCING DIAMOND COMPOSITE STRUCTURE FOR ELECTRONIC COMPONENTS

[75] Inventors: Reinhard Zachai, Guenzburg; Hans-Juergen Fuesser, Gerstetten-Dettingen; Tim Gutheit, Ulm, all of Germany

[73] Assignee: Daimler-Benz AG, Stuttgart, Germany

[21] Appl. No.: 432,853

[22] Filed: May 2, 1995

[30] Foreign Application Priority Data

May 4, 1994 [DE] Germany ............... 44 15 601.4

[51] Int. Cl.⁶ ..................... H01L 21/20; C30B 29/04
[52] U.S. Cl. .................. 437/103; 117/929; 257/77
[58] Field of Search ............... 437/103; 117/929; 257/77

[56] References Cited

U.S. PATENT DOCUMENTS

| | | | |
|---|---|---|---|
| 5,006,203 | 4/1991 | Purdes | 117/929 |
| 5,034,784 | 7/1991 | Yamazaki | 257/77 |
| 5,173,761 | 12/1992 | Dreifus et al. | 257/77 |
| 5,243,199 | 9/1993 | Shiomi et al. | 257/77 |
| 5,252,840 | 10/1993 | Shiomi et al. | 257/77 |
| 5,254,862 | 10/1993 | Das et al. | 257/77 |

FOREIGN PATENT DOCUMENTS

| | | | |
|---|---|---|---|
| 4197431 | 7/1992 | Japan | 117/929 |
| 001314 | 1/1992 | WIPO | 117/929 |

Primary Examiner—R. Bruce Breneman
Assistant Examiner—Ramamohan Rao Paladugu
Attorney, Agent, or Firm—Evenson, McKeown, Edwards & Lenahan

[57] ABSTRACT

The invention relates to a composite structure for electronic components comprising a growth substrate, an intermediate layer having substantially a crystallographic lattice structure arranged on the growth substrate, and a diamond layer applied on top of the intermediate layer, and to a process for producing a composite structure of this type. In order to obtain a diamond layer of highest quality, the intermediate layer has substantially a zinc blende or diamond or a calcium fluoride structure, in which at the outset of the intermediate layer the difference between the lattice constant of the intermediate layer and the lattice constant of the growth substrate, relative to the lattice constant of the growth substrate, is less than 20%, in particular less than 10%, and in which at the transition from the intermediate layer to the diamond layer for the lattice constant of the intermediate layer and the lattice constant of the diamond layer the value of the expression $$|(n*a_{ZS} - m*a_D)|/n*a_{ZS}$$

is less than 0.2, in particular less than 0.1, wherein n and m are natural numbers,
$a_D$ is the lattice constant of the diamond layer, and
$a_{ZS}$ is the lattice constant of the intermediate layer at the transition to the diamond layer.

14 Claims, 3 Drawing Sheets

PROCESS OF PRODUCING DIAMOND COMPOSITE STRUCTURE FOR ELECTRONIC COMPONENTS

BACKGROUND OF THE INVENTION

This invention relates to a composite structure for electronic components comprising a growth substrate, an intermediate layer arranged on the growth substrate, and a diamond layer applied over the intermediate layer, and to a process for producing such a composite structure as disclosed in published European Patent Application No. EP 282,054 A1.

Published European Patent Application No. EP 282,054 A1 describes a composite structure for electronic components and a process for producing such composite structures. The composite structure comprises a growth substrate of crystalline Si (silicon) or of crystalline GaAs (gallium arsenide), on which an intermediate layer of crystalline SiC (silicon carbide) is deposited and a diamond layer deposited on the intermediate layer, in which the layers are deposited by means of CVD (chemical vapor deposition) on the growth substrate. The intermediate layer of SiC thereby serves to diminish (compensate for) the prevailing lattice mismatch of approximately 52% or approximately 58% between the growth substrate on the one hand, whose lattice constant is approximately 5.43 Å (Si) or 5.65 Å (GaAs), and the applied diamond layer on the other hand with a lattice constant of approximately 3.57 Å, with respect to the lattice constant of the diamond layer, in order to thereby facilitate an acceptable growth of the diamond layer on such growth substrates. Since SiC has a lattice constant of approximately 4.36 Å, its lattice mismatch with respect to the lattice constant of the growth substrate amounts to approximately 25% (Si) or 30% (GaAs), and with respect to the diamond layer 22%, in which case the difference is with respect to the lattice constant of the diamond layer. By means of the bridging of the crystalline SiC-layer, the effects of the existing lattice mismatch on the quality of the deposited diamond layer are minimized. Despite this measure, the quality of the deposited diamond layer, however, is still unsatisfactory because the number and density of the grain boundaries and displacements is very high.

SUMMARY OF THE INVENTION

It is the object of the invention to further develop the aforedescribed fundamental composite structure to such an extent that the quality of a diamond layer applied on a growth substrate is improved.

Furthermore it is an object of the invention to develop a process for producing a diamond layer disposed on such growth substrates.

These and other objects are achieved in the present invention by providing a composite structure for an electronic component comprising a growth substrate, an intermediate layer arranged on the growth substrate, and a diamond layer applied over the intermediate layer, in which the substrate, intermediate layer and diamond layer each have a crystal lattice exhibiting a lattice constant; the intermediate layer has substantially a crystallographic lattice structure selected from the group consisting of a zinc blende structure, a diamond structure and a $CaF_2$ structure; the crystal lattice of the intermediate layer has a fixed orientation relative to the crystal lattice of the growth substrate; the lattice constants of the growth substrate and of the intermediate layer adjacent the growth substrate exhibit a difference amounting to less than 20% of the lattice constant of the intermediate layer adjacent the growth substrate, and the lattice constants of the diamond layer and of the intermediate layer adjacent the diamond layer satisfy the expression:

$$|(n*a_{ZS}-m*a_D)|/n*a_{ZS}<0.2$$

where n and m are positive integers, $a_D$ is the lattice constant of the diamond layer, and $a_{ZS}$ is the lattice constant of the intermediate layer adjacent the diamond layer.

In further aspects of the invention, the objects of the invention are also achieved by providing a process for producing a composite structure for electronic components comprising the steps of cleaning a surface of a growth substrate; applying an intermediate layer over the cleaned surface of the growth substrate; and applying a diamond layer over the intermediate layer, in which the applied intermediate layer has substantially a crystallographic lattice with a zinc blende structure, a diamond structure or a $CaF_2$ structure; and the intermediate layer and the diamond layer have lattice constants which satisfy the expression:

$$|(n*a_{ZS}-m*a_D)|/n*a_{ZS}<0.2$$

in which n and m are positive integers, $a_D$ is the lattice constant of the diamond layer, and $a_{ZS}$ is the lattice constant of the intermediate layer adjacent the diamond layer.

In accordance with the invention, the lattice constants of the intermediate lattice do not exhibit a constant value across the thickness of the intermediate layer, but instead are initially substantially matched to the lattice constant of the growth substrate and as the thickness of the intermediate layer increases, they approach a lattice constant which has a whole number ratio, for example 1:1 or 2:3, with the lattice constant of a diamond. Alternatively, for example, a material can be utilized for the intermediate layer (with Si substrates, for example, $CoSi_2$) whose modified lattice mismatch is very small. In both cases the stress at the boundary surfaces between the respective layers (growth side of the growth substrate/intermediate layer and intermediate layer/diamond layer) is substantially diminished. This facilitates a good quality and particularly a deposition with improved orientation of the deposited diamond layer. The deposition of the individual layers can be effected by means of the known epitaxial process, in which MBE (molecular beam epitaxy) and RF-plasma MBE or microwave-plasma MBE or CVD (chemical vapor deposition), are especially suitable.

The improved quality of the diamond layers relates to the lower number and density of displacements and grain boundaries in the layer, and to better charge carrier mobility and thermal conductivity. The orientation of the individual crystals deviates from the orientation of the substrate with a half-power bandwidth of approximately 6° so that the crystals are tipped or twisted. For electronic applications it is necessary that the density of the displacements and the grain boundaries be reduced. The quality of the orientation of the crystallites along a predetermined substrate orientation can be determined by X-ray texture analysis. The charge carrier (Hall) mobility, which strongly depends on the displacement density, can be measured by Hall effect measurements. Diamond layers with improved orientation also exhibit higher thermal conductivity.

Since in the invention, the composite structure, while maintaining good quality of the diamond layer, can utilize as the growth substrate a commercially available and inexpensive growth substrate, particularly a growth substrate of Si or GaAs, whose lattice constants differ from the lattice constant of the diamond layer by more than 25% with respect to the lattice constant of a diamond, a composite structure of this type can be produced a favorable cost. Tests have also shown that oriented diamond layers exhibit improved thermal properties (e.g. thermal conductivity) compared to statistically (random) oriented layers.

In accordance with the invention, the lattice constant of the intermediate layer may vary as a function of the thickness of the layer, so that at the interface with the growth substrate, it will have a lattice constant at least close to that of the growth substrate, and at the interface with the diamond layer, it will have a lattice constant which at least approaches that of the diamond layer.

It is of particular advantage if the lattice constant of the intermediate layer is modified in such a way that at the transition from the intermediate layer to the diamond layer, the difference between a whole number multiple of the lattice constant of the intermediate layer and a whole number multiple of the lattice constant of the diamond layer is less than 20%, and preferably less than 10% with respect to the same whole number multiple of the lattice constant of the intermediate layer, and ideally is approximately zero. In other words, the value of the expression $$|(n*a_{ZS} - m*a_D)|/n*a_{ZS}$$

in which n and m are positive integers, $a_D$ is the lattice constant of the diamond layer, and $a_{ZS}$ is the lattice constant of the intermediate layer at its transition to the diamond layer, is less than 0.2, and preferably less than 0.1.

For example, an intermediate layer of $CoSi_2$ fulfills the conditions for a good modified lattice fit with a diamond layer if n is 3 and m is 2:

$$(2*5.36 - 3*3.57)/3.57 = 0.3\%$$

The lattice misfit or mismatch has a large, non-linear influence on the quality of the interface and consequently on the quality of the applied layer. The smaller the mismatch, the better the quality. As a result of the mismatch, the applied layer (e.g. the diamond layer) is stressed, and it has a tendency to relax by introducing displacements, i.e. the lattice constant approaches the equilibrium lattice constant. This relaxation occurs above a critical layer thickness. If the difference with respect to the underlying layer is smaller, then this relaxation commences later, or in other words the displacement density in the diamond layer decreases.

It is not necessary for the intermediate layer to be deposited over the entire growth surface side of the growth substrate. Rather, it is sufficient to have a so-called island growth, i.e. the intermediate layer can be deposited in limited regions. In some cases this island growth, which arises in particular when there is a high proportion of carbon, can even favor the growth of the diamond.

BRIEF DESCRIPTION OF THE DRAWINGS

The invention will be explained in further detail hereinafter with reference to illustrative working embodiments shown in the accompanying drawings in which.

DETAILED DESCRIPTION OF PREFERRED EMBODIMENTS

Figure 1:
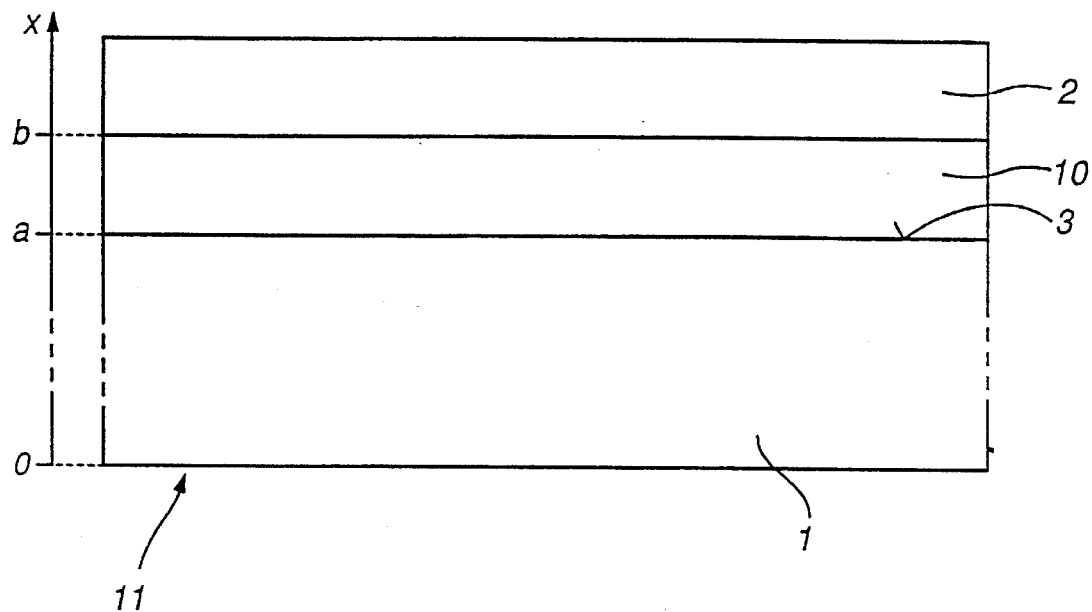
FIG. 1 is a schematic representation of a section through a composite structure according to the invention with an alloy as intermediate layer.

FIG. 1 depicts a section through a composite structure 11 for electronic components according to the invention. The composite structure 11 comprises a substantially monocrystalline growth substrate 1, on the previously cleaned growth side 3 of which a silicon-carbon alloy is deposited. In regard to its crystallography, the alloy has substantially a zinc blende-like or a diamond-like or a calcium fluoride-like ($CaF_2$) lattice structure, in which the atoms of the alloy (Si and C) are statistically distributed within the lattice of the alloy.

Silicon naturally has a crystalline diamond structure; $CoSi_2$ naturally has a $CaF_2$ structure. Carbon, in contrast, exists in graphite form (hexagonal lattice); diamond is only metastable. This means that if one does not introduce so much carbon into silicon that the resulting alloy becomes amorphous, then the resulting alloy will naturally assume the desired diamond structure.

The crystal lattice of the intermediate layer formed as an alloy 10 has a fixed orientation with respect to the crystal lattice of the growth substrate 1, in which case 20% to 100% of the crystallites of the diamond layer 2 with dimensions between 0.1 μm and 200 μm again are oriented on the crystal lattice of the intermediate layer. In this case, the orientation of the crystallites is so constituted that the crystal orientations corresponding to each other (Miller indices hkl) in the intermediate layer 10 and in the crystallites are parallel to each other within the scope of a possible misorientation of less than 10°. A diamond layer 2 is subsequently applied on top of this alloy.

Figure 2:
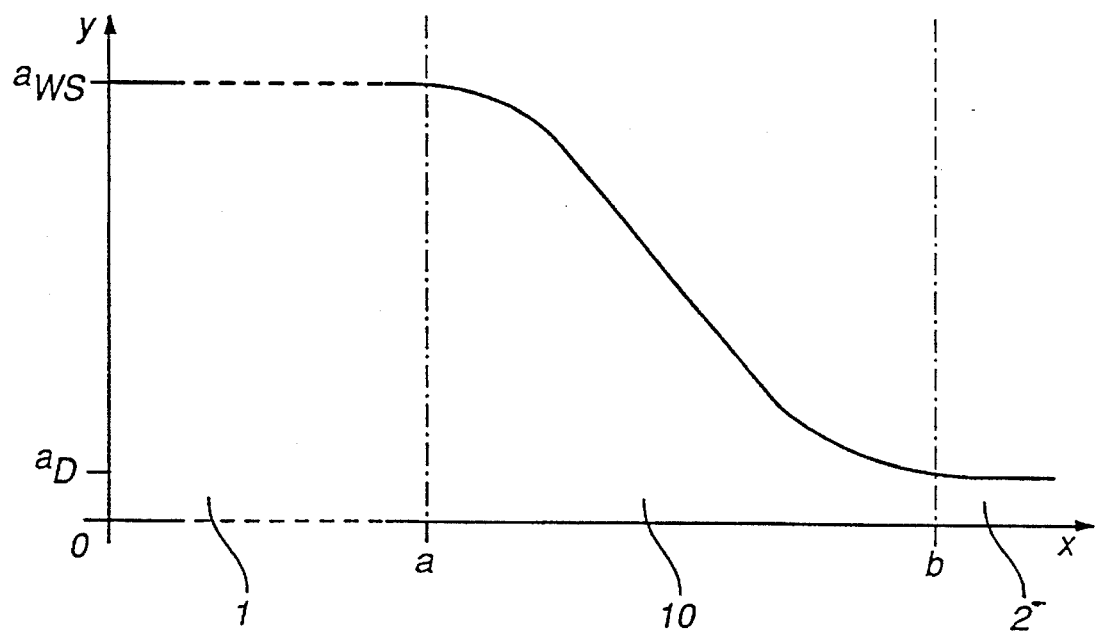
FIG. 2 is a diagram of the change of the lattice constant of the composite structure according to FIG. 1 with a modified lattice fit of 1:1 between the intermediate layer and the diamond layer.

In FIG. 2 the change of the lattice constant of the composite substrate 11 is illustrated, with the thickness of the composite structure 11 recorded along the x-axis and the respective lattice constant in the region of the respective layer, that is to say the growth substrate 1, the Si—C alloy (intermediate layer 10) and the diamond layer 2, is recorded along the y-axis. The boundaries between the various layers are designated as follows "O", beginning of the growth substrate 1; "a", beginning of the intermediate layer 10; and "b", beginning of the diamond layer 2.

In accordance with the diagram of FIG. 2 the lattice constant of the alloy lattice changes with increasing thickness of the intermediate layer 10, i.e. with increased spacing from the growth substrate 1, with the proportion of carbon in the alloy increasing and the proportion of silicon in the alloy decreasing. A decrease of the lattice constant $a_{ZS}$ of the alloy lattice is associated with this change in the composition of the alloy, by means of which the lattice constant $a_{ZS}$ of the alloy lattice at the outset, i.e. in the vicinity of the silicon growth substrate 1, corresponds approximately to the lattice constant $a_W$ of the growth substrate, and at the end, i.e. in the vicinity of greatest spacing of the alloy from the growth substrate 1, the lattice constant of the alloy lattice corresponds approximately to the lattice constant $a_D$ of the diamond layer 2 subsequently deposited on the intermediate layer 10. In this way the lattice mismatch existing between the silicon growth substrate 1 and the diamond layer 2, which amounts to more than 50% with reference to the lattice constant $a_D$ of the diamond layer 2 and which leads to diamond layers 2 of inferior quality, is substantially diminished.

Advantageously, when the intermediate layer 10 is formed as an Si—C alloy, the crystal structure of crystalline silicon remains so that epitaxial growth of the diamond layer 2 on the alloy is facilitated. Diamond layers 2 produced in this way exhibit at least polycrystalline growth with a high degree of orientation.

The layers are produced as follows. A silicon atom beam is produced by evaporating solid silicon with an electron beam evaporator under ultra-high vacuum; a carbon atom beam is produced in a similar fashion. The ratio of Si to C can be varied from 0 to 1 by appropriately adjusting the two sources. A substrate of single crystal silicon is placed in the beam, and an alloy layer is deposited on the surface of the substrate. The lattice constant of the mixed layer varies in approximately linear manner between Si and diamond proportional to the carbon content (according to Vegard's Law). This can be measured by X-ray diffraction in layers produced in the foregoing manner.

If the gradient is selected small enough, the relaxation of the mixed layer (i.e. alloy layer), which is stressed relative to the silicon substrate, leads to a decrease in the lattice constant. And if this transition is sufficiently gentle, then the crystal structure will be retained.

Through the modification of the lattice constants by means of the alloy according to the invention, a diamond layer 2 of good quality can be deposited on the intermediate layer 10, which can be considered, from the frame of reference of the diamond layer 2 which is to be deposited thereon, to be the growth side 3 of a modified growth substrate 1 formed of silicon.

One possible process for producing a composite structure 11 according to the invention is described hereinafter. The growth substrate 1 is installed in an MBE (molecular beam epitaxy) reactor and the reactor is evacuated. The pressure in the reactor should be less than $1*10^{-6}$ mbar. Pressures of approximately $10^{-8}$ mbar are advantageous. The surface of the growth substrate 1 may be previously cleaned by wet chemical techniques. The growth substrate 1 can be cleaned once again inside the MBE reactor, in which case this cleaning step may be effected in a simple manner by heating the growth substrate 1 to a temperature above 700° C. Furthermore, the cleaning may be effected by means of a plasma generated by means of radio waves or microwaves. In this case it may also make sense to heat the growth substrate 1 and/or to apply a predetermined electric potential to the growth substrate 1. Plasma cleaning of the substrate may be effected, for example, at a pressure of 29 mbar, in an $H_2$ gas stream at a flow rate of 300 sccm, at a microwave power of 750 watts, with heating to 900° C. for a duration of 10 minutes.

If the composite structure 11 is produced, for example, with a microwave supported MWCVD (microwave chemical vapor deposition), the cleaning of the surface of the growth substrate 1 inside a MWCVD reactor of this type may also be effected by means of a process gas.

After the cleaning of the growth substrate 1 in the MBE reactor, pure silicon is deposited on the growth side 3 of the growth substrate 1 by means of a solid silicon source, for example, commercially available high purity (99.99%) silicon. The pure silicon is gradually replaced with carbon which is supplied from a solid carbon source, for example, commercially available high purity (99.99%) carbon. During the mixed deposition of carbon and silicon, a silicon-carbon alloy with a zinc blende-like or diamond-like alloy lattice in which the carbon atoms and the silicon atoms are statistically distributed, forms on the growth substrate 1. Deposition may be effected, for example, at a rate of 0.1 nm/s. The resulting layer thicknesses will typically range from 200 to 1000 nm.

In order that the lattice constant of the alloy lattice, which at the beginning of the alloy corresponds approximately to the lattice constant $a_W$ of the silicon growth substrate 1, can be decreased to the value of the lattice constant $a_D$ of a diamond, the proportion of silicon in the alloy is decreased to approximately zero, while the proportion of carbon in the alloy, i.e. in the intermediate layer 10, is increased by appropriate adjustment of the respective solid sources as the thickness of the alloy layer increases. For example, the source may be regulated by closed-loop feedback in order to maintain a constant mass spectroscopy signal for carbon at 12 amu [see Peter et al., J. Vac. Sci. Tech. A, Vol. 9, No. 6, pages 3061–63 (1991)].

It has thereby proved to be advantageous to vary the composition of the alloy within a thickness range of approximately 0.1 μm to 2 μm. The solid sources consist of high purity silicon (99.999%) or high purity carbon (99.99%). High purity graphite is particularly advantageous. The deposition of the intermediate layer takes place at a reactor pressure of less than $10^{-6}$ mbar. The temperature of the growth substrate 1 amounts to between 200° C. and 1200° C., particularly between 450° C. and 750° C. During the growth, the surface of the growing intermediate layer 10 can be additionally be subjected to a flux of low-energy ions, for example ion having an energy of from about 0 to about 200 eV, in particular argon ions or nitrogen ions with an average energy of at most approximately 100 eV, in order to favorably influence the surface kinetics of the growing intermediate layer 10. A suitable flux of low energy ions may be produced, for example, with an ECR plasma source as described by Popov et al., J. Vac. Sci. Tech. A, Vol. 8, No. 3, pages 1009–12 (1990).

Because diamond has a higher surface energy than silicon, it is difficult to form diamond nuclei when attempting to deposit a diamond layer on a silicon substrate. However, the presence of carbon atoms in the surface layer of the growth substrate increases the surface energy of the substrate. Furthermore, by applying a negative bias voltage with respect to the plasma potential, carbon-containing positive ions are accelerated toward the surface (40 to 100 eV at a U-bias of 220 V). In this way it is possible to increase the surface energy of the substrate. Without the bias, no nucleation is observed, but if bias is applied, nucleation can be detected. These nuclei are, in part, built into the surface layers and above a critical size can develop into oriented crystallites. Even if carbon is already present in the surface of the substrate, this process will further promote the process of crystallite formation.

At very high carbon contents, the surface of a deposited carbon/silicon alloy increases in roughness as the growth of the layer proceeds until island growth occurs. Under normal conditions, a deposited alloy layer may have a surface roughness of about 5 nm after an etching step to clean the surface.

In order to protect it, the intermediate layer 10 can be subsequently covered with a silicon sacrificial layer which is etched away before the subsequent diamond deposition. This avoids removal of the intermediate layer 10 during the hydrogen plasma cleaning with which the diamond deposition procedure typically begins. Otherwise, if the plasma cleaning were carried out too long or the intermediate layer 10 were too thin, the intermediate layer could be eaten away.

The deposition of the diamond layer takes place in the presence of a hydrogen/methane gas stream which contains between 0.1 and 10% methane, at a temperature between 200° C. and 900° C., preferably above 600° C. A suitable deposition procedure is disclosed, for example, in published German Patent Application No. DE 4,233,085. The starting crystal forming phase can be promoted by the application of a bias voltage between +50 V to −300 V, in particular at −150 V.

The advantageous nature of the process according to the invention is apparent inter alia in that the composite substrate 11 which is produced has a modified lattice mismatch at the transitions between the respective layers which is less than 5%, in particular less than 3%.

Figure 3:
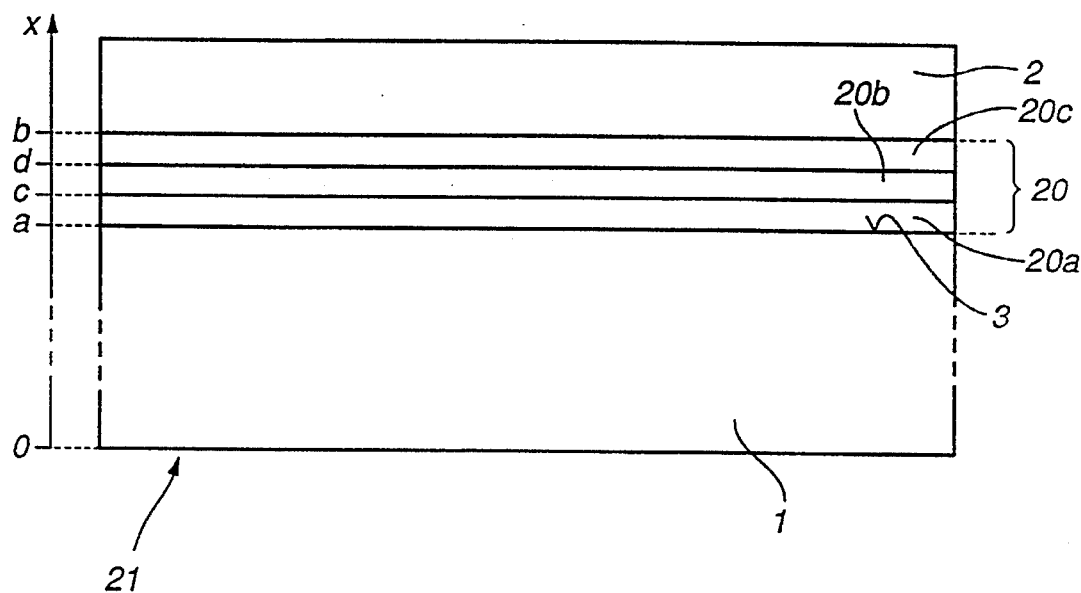
FIG. 3 is a schematic representation of a section through a composite structure according to the invention with an intermediate layer composed of a plurality of individual layers.
Figure 4:
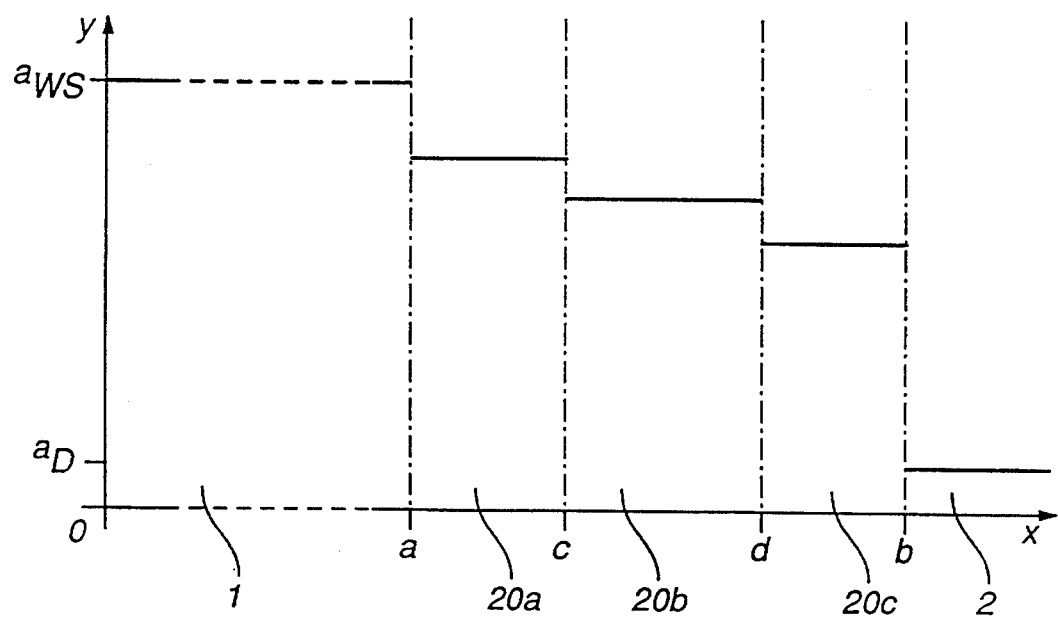
FIG. 4 is a diagram of the change of the lattice constant of the composite structure according to FIG. 3 with a modified lattice fit between the intermediate layer and the diamond layer.

In FIG. 3 a further composite structure 21 is illustrated. The change of the lattice constant of this composite structure 21 perpendicular to the surface of the growth substrate is shown in FIG. 4. In order to avoid unnecessary repetition, only the differences with respect to the working embodiment according to FIGS. 1 and 2 will be discussed.

In contrast to the working embodiment according to FIGS. 1 and 2, the intermediate layer 20 of the composite structure 21 according to FIGS. 3 and 4 is composed of a plurality of individual layers 20a, 20b and 20c which are stressed, in particular elastically stressed, with respect to each other. The individual layers 20a, 20b and 20c can be formed of binary (e.g. $CoSi_2$, AlN, GaAs, InP, ZrN) and/or ternary (e.g. InGaAs, InGaP, InAlAs) and/or even higher component (e.g. InGaAsP) crystalline substances and/or alloys of uniform and/or varying composition. $CoSi_2$ has a lattice constant of 5.36 Å; AlN(cubic) a constant of 4.12 Å; GaAs a constant of 5.67 Å; InP a constant of 5.88 Å; and ZrN a constant of 0.57 Å. The lattice constants of the ternary and quaternary mixtures may adjusted to desired values by varying the proportions of the constituents. The individual layers 20a, 20b and 20c are adjusted with respect to each other in such a way that their lattice mismatches with respect to each other amount to a maximum of 20%, in particular a maximum of 10%. The lattice mismatch of the individual layer 20a which faces the growth substrate 1 is less than 10%.

In order that the thickness of the intermediate layer 20 does not assume too large a value when there are large differences between the lattice constant $a_{WS}$ of the growth substrate 1 and the lattice constant $a_D$ of a diamond layer 2, in such cases a modified lattice fit is utilized in accordance with which the expression $$|(n*a_{ZS}-m*a_D)|/n*a_{ZS}$$

in which n and m are positive integers, $a_D$ is the lattice constant of the diamond layer, and $a_{ZS}$ is the lattice constant of the intermediate layer at its transition to the diamond layer; has a value of less than 0.2, and in particular less than 0.1. In modified lattice fits of this type, the lattice constant of the last individual layer 20c of an intermediate layer 20 of this type which faces the diamond layer 2, has a whole number ratio to the lattice constant $a_D$ of the diamond layer 2 within an interval amounting to 20%, in particular 10%, in which the whole numbers of this relationship are advantageously less than 10, in particular less than 5. In the present working embodiment illustrated schematically in FIGS. 3 and 4, this ratio may, for example, be 2:3. This means that three unit cells of the diamond layer 2 are arranged on two unit cells of the last individual layer 20c of intermediate layer 20, with the difference between the length of two unit cells of the last individual layer 20c and the length of three unit cells of the diamond layer 2 being less than 20%, in particular less than 10%, with reference to three times the lattice constant of the last individual layer 20c.

In order to produce the intermediate layer 20, a plurality of individual layers 20a, 20b and 20c are deposited on the growth side 3 of a cleaned growth substrate 1. The lattice constants of these individual layers 20a, 20b and 20c become smaller as the number of individual layers increases. For example, a plurality of individual layers each having a constant ratio of carbon to silicon, but in which the ratios increase successively from layer to layer, can be deposited one after another using the procedure described above.

Figure 5:
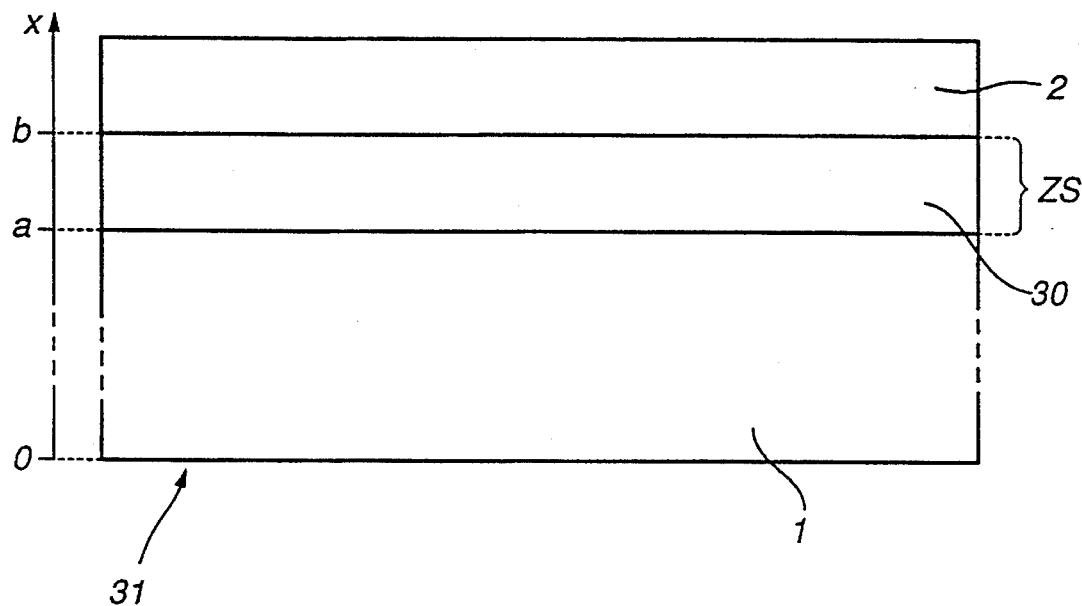
FIG. 5 is a schematic representation of a section through a composite structure according to the invention with an intermediate layer which is formed from a region of the growth substrate into which carbon atoms have been introduced.
Figure 6:
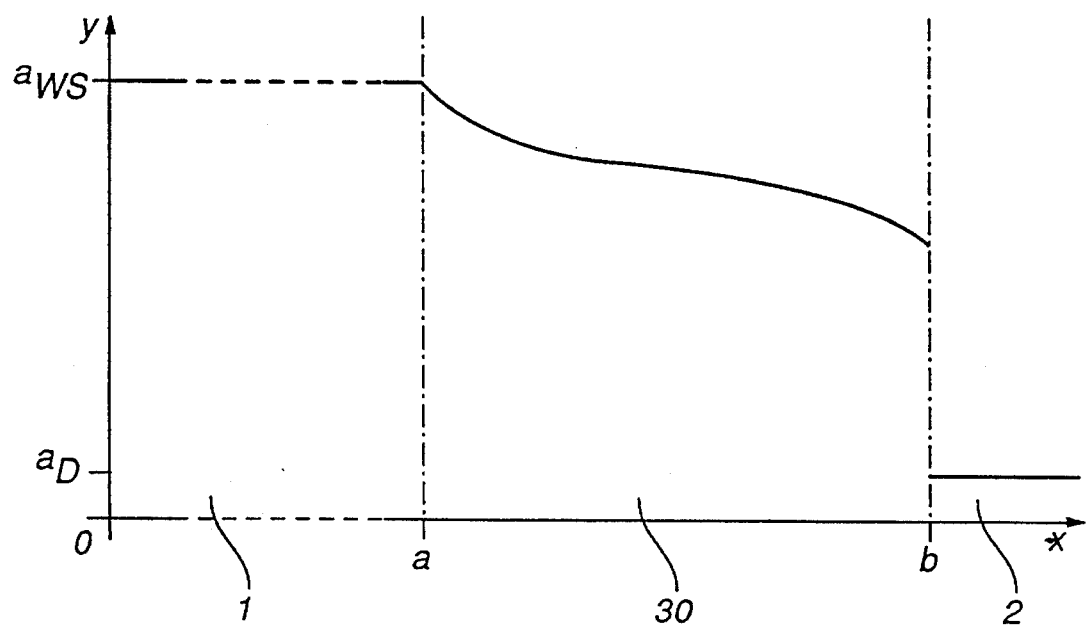
FIG. 6 is a diagram of the change of the lattice constant of the composite structure according to FIG. 5 with a modified lattice fit between the intermediate layer and the diamond layer.

A further working example of a composite structure 31 in accordance with the invention is illustrated in FIG. 5, and the change of its lattice constants across the thickness of the composite structure is illustrated in FIG. 6. Also in this case, in order to avoid unnecessary repetition, only the differences with respect to the working embodiments according to FIGS. 1 and 2 or FIGS. 3 and 4 will be discussed.

The intermediate layer 30 of this working example is formed by a region of the growth substrate 1 in which carbon atoms are arranged. These carbon atoms effect a change in the lattice constant $a_W$ of the growth substrate 1 in this region, in which the lattice structure of the growth substrate 1 is substantially retained. This type of growth surface 3 of growth substrate 1 in the present working example has a lattice constant $a_{ZS}$ which may have a ratio, for example, of approximately 2:3 with the lattice constant $a_D$ of a diamond layer 2 to be deposited thereon. This case also relates to a modified lattice fit, like that in the working example according to FIGS. 3 and 4, between the diamond layer 2 and an intermediate layer 30 formed by carbon atoms embedded in the surface of the growth substrate 1.

The production of an intermediate layer 30 of this type is advantageously carried out in that the carbon atoms are diffused in a known manner or implanted by means of ion implantation into the growth surface 3 of the growth substrate 1. For example, carbon can be implanted in silicon by accelerating $C^+$ ions at 30 kV and targeting them at a Si substrate at a dosage of 1 $E^{16}$ ions/cm². The carbon concentration had a Gaussian profile with a maximum of 2.3% at a depth of 90 nm. The depth of penetration is controlled by adjusting the energy. The concentration is regulated by adjusting the dosage (=time of implantation). Since both the maximum of the diffusion profile and also the maximum of the implantation profile are disposed several atom layers underneath the surface of the treated surface of the growth substrate 1, it is advantageous in both cases to remove some layers of atoms from this surface until the new surface has a lattice constant with which it is possible to appropriately match the lattices. The removal of this surface region by a predetermined layer thickness is advantageously carried out by means of etching.

The foregoing description and examples have been set forth merely to illustrate the invention and are not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A process for producing a composite structure for electronic components, said process comprising the steps of cleaning a surface of a growth substrate;

applying an intermediate layer over the cleaned surface of the growth substrate; and applying a diamond layer over the intermediate layer, wherein:

the applied intermediate layer has substantially a crystallographic lattice with a zinc blende structure, a diamond structure or a $CaF_2$ structure, said intermediate layer consisting of an alloy with alloy constituent atoms statistically distributed throughout its crystal lattice, and said alloy having a composition which changes as the thickness of the intermediate layer increases; and wherein:

the intermediate layer and the diamond layer have lattice constants which satisfy the expression:

$$|(n*a_{ZS}-m*a_D)|/n*a_{ZS}<0.2$$

in which n and m are positive integers, $a_D$ is the lattice constant of the diamond layer, and $a_{ZS}$ is the lattice constant of the intermediate layer adjacent the diamond layer.

2. A process according to claim 1, wherein said intermediate layer consists of a carbon-containing alloy, and the proportion of carbon in the alloy increases as the thickness of the intermediate layer increases.

3. A process according to claim 1, wherein the growth substrate consists essentially of substantially monocrystalline silicon; the intermediate layer consists essentially of silicon-carbon alloy with atoms of silicon and carbon statistically distributed therein, and the proportion of silicon in the intermediate layer decreases with increasing distance from the growth substrate.

4. A process according to claim 1, wherein the intermediate layer is composed of a plurality of individual sublayers each having a lattice constant which differs from that of adjacent sublayers by a maximum of 20%, and each of the sublayers is elastically stressed with respect to adjacent sublayers.

5. A process according to claim 4, wherein each of the sublayers has a lattice constant which differs from that of adjacent sublayers by a maximum of 10%.

6. A process according to claim 1, wherein the intermediate layer comprises a surface layer of the growth substrate into which carbon atoms have been embedded by means of diffusion or by means of ion implantation.

7. A process according to claim 6, further comprising after the carbon atoms have been embedded in the surface layer of the growth substrate, removing a thickness of said surface layer by etching prior to applying the diamond layer over the intermediate layer.

8. A process according to claim 1, wherein the intermediate layer and the diamond layer are applied by molecular beam epitaxy of known solid material sources.

9. A process according to claim 1, wherein the intermediate layer is produced by applying onto a silicon growth substrate a first material which deposits pure silicon and a second material which admixes carbon with the deposited silicon, a decreasing proportion of the first material and an increasing proportion of the second material being applied as the intermediate layer increases in thickness.

10. A process according to claim 1, wherein a flux of ions having an energy less than about 200 eV is applied to the intermediate layer as the intermediate layer is deposited on the growth substrate.

11. A process according to claim 10, wherein said ions are selected from the group consisting of nitrogen ions, argon ions, and mixtures of nitrogen ions and argon ions.

12. A process according to claim 1, further comprising covering the intermediate layer with a protective layer of silicon and subsequently removing the protective layer by etching prior to applying the diamond layer over the intermediate layer.

13. A process according to claim 1, wherein the intermediate layer has a surface roughness greater than 5 nm prior to applying the diamond layer thereover.

14. A process according to claim 1, further comprising prior to applying the diamond layer over the intermediate layer, increasing the surface energy of the intermediate layer relative to the surface energy of the growth substrate in order to facilitate diamond nucleation on the surface of the intermediate layer.

* * * * *